(12) United States Patent
Rogers et al.

(10) Patent No.: US 7,567,135 B2
(45) Date of Patent: Jul. 28, 2009

(54) POWER MONITORING DEVICE AND METHODS THEREOF

(75) Inventors: Aaron S. Rogers, Pflugerville, TX (US);
Daniel W. Bailey, Austin, TX (US);
Roger D. Pannell, Brookline, NH (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 66 days.

(21) Appl. No.: 11/947,919

(22) Filed: Nov. 30, 2007

(65) Prior Publication Data

US 2009/0140819 A1 Jun. 4, 2009

(51) Int. Cl.
*H03B 5/08* (2006.01)
*H03B 5/12* (2006.01)
(52) U.S. Cl. .......................................... 331/48; 331/173
(58) Field of Classification Search ............... 331/2, 331/46, 48, 172, 173
See application file for complete search history.

(56) References Cited

U.S. PATENT DOCUMENTS

2005/0114056 A1* 5/2005 Patel et al. .................... 702/75

* cited by examiner

*Primary Examiner*—David Mis

(57) ABSTRACT

To determine performance degradation at functional module in a normal power state due to a power control device, voltages are applied to oscillators at a power diagnostic module. A first voltage is a supply voltage for the data processing device, and a second voltage is a supply voltage applied at a functional module of the data processing device. Counters are adjusted based on the oscillators to determine the oscillators' respective frequencies. In addition, the power diagnostic module can include a timer to measure the length of time that the functional module is in a low-power state, and an analog to digital converter to measure the voltage applied to the functional module during transitions to and from the low-power state.

20 Claims, 5 Drawing Sheets

POWER MONITORING DEVICE AND METHODS THEREOF

FIELD OF THE DISCLOSURE

The present disclosure relates to data processing devices and more particularly to power monitoring devices for data processing devices.

BACKGROUND

Some data processing devices can place one or more functional modules in a normal state to perform normal specified functions or in a low-power state in order to conserve power. Such devices can include a power control device to control application of a supply voltage to the functional modules. When the power control device reduces the supply voltage applied at a functional module, the module is placed into a low-power state, thereby conserving power. However, inclusion of the power control device can also impact the performance of the functional module in the normal mode of operation. Accordingly, a device or method of determining the impact of a power control device on a functional module would be useful.

DETAILED DESCRIPTION

A power diagnostic module including two oscillators is disclosed. A first voltage is applied to power a first oscillator and a second voltage is applied to power a second ring oscillator. The first voltage is a supply voltage for the data processing device, and the second voltage is a supply voltage applied at a functional module of the data processing device. Counters are adjusted based on the oscillators to determine the oscillators' respective frequencies. The values recorded at the counters indicate a difference in performance of the two oscillators, and also represents the performance degradation to the functional module in a normal power state due to a power control device. In addition, the power diagnostic module can include a timer to measure the length of time that the functional module is in a low-power state, and an analog to digital converter to measure the voltage applied to the functional module during transitions to and from the low-power state.

Figure 1:
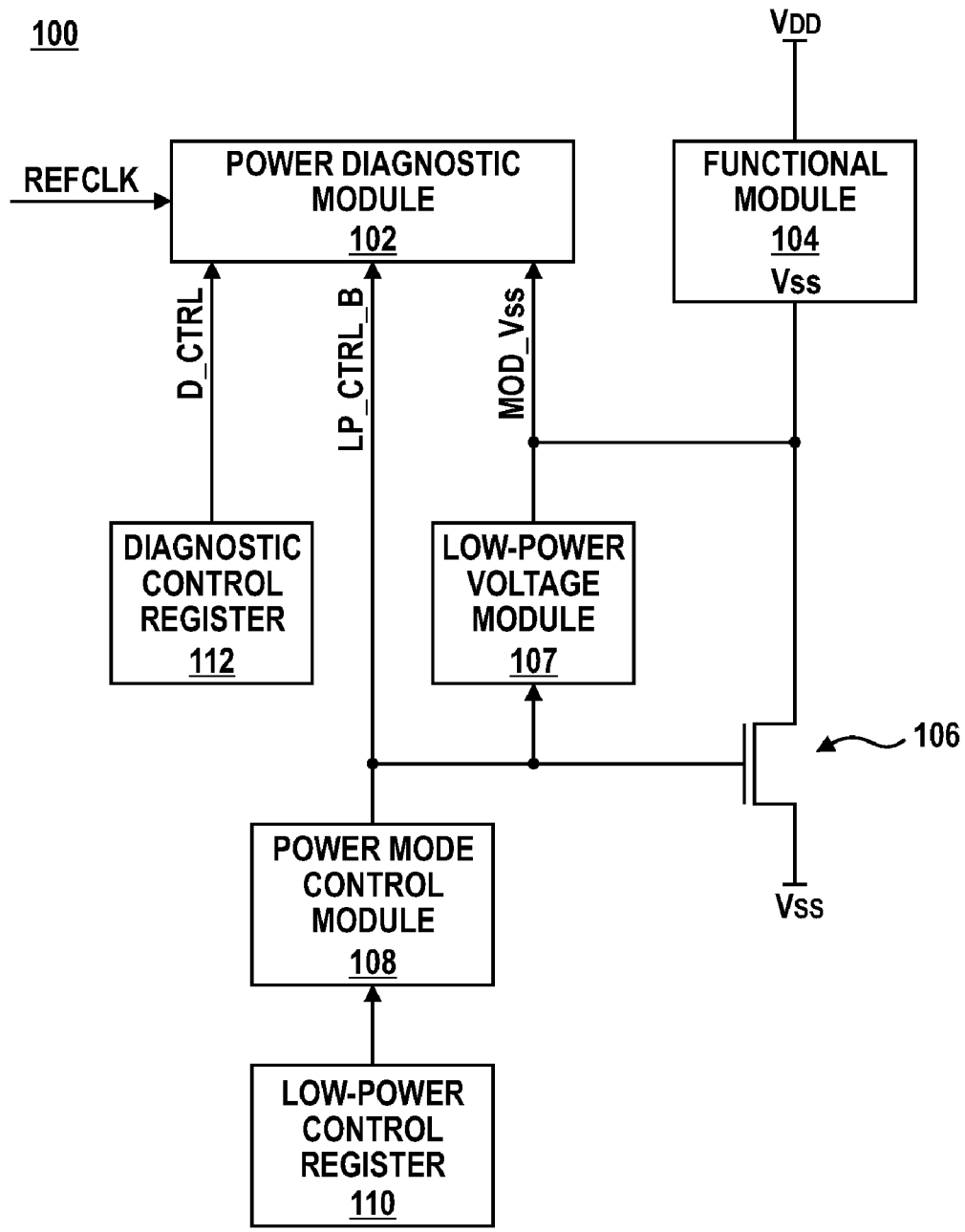
FIG. 1 is a combined circuit and block diagram of a particular embodiment of a data processing device in accordance with one aspect of the present disclosure.

Referring to FIG. 1, a combined block and circuit diagram of a particular embodiment of a data processing device 100 is illustrated. The data processing device 100 can be a processor, such as a general purpose microprocessor, an application specific data processor, and the like. The data processing device 100 includes a power diagnostic module 102, a functional module 104, a switch (e.g. transistor) 106, a low-power voltage module 107, a power control module 108, a low-power control register 110, and a diagnostic control register 112. The power diagnostic module 102 includes an input to receive a clock signal labeled REFCLK, an input connected to a supply voltage labeled $V_{SS}$, an input to receive a signal D_CTRL, an input to receive a signal LP_CTRL_B, and an input to receive a signal MOD_VSS. The functional module 104 includes an input connected to a voltage reference labeled $V_{DD}$ and a second input labeled "$V_{SS}$." The transistor 106 includes a first current electrode connected to the $V_{SS}$ supply voltage, a second current electrode connected to the $V_{SS}$ input of the functional module 104 to provide the signal MOD_VSS, and a control electrode to receive the signal LP_CTRL_B. The low-power voltage module 107 includes an input to receive the LP_CTRL_B signal and an output connected to the $V_{SS}$ input of the functional module 104. The power mode control module 108 includes an input and an output to provide the signal LP_CTRL_B. The low-power control register 110 includes an output connected to the input of the power control module 108. The diagnostic control register 112 includes an output to provide the signal D_CTRL.

The functional module 104 is a module that performs one or more specified functions for the data processing device 100 in a normal mode of operation. The functional module 104 can also be placed in a low-power mode. In the low-power mode, one or more storage elements of the functional module 104 can retain stored data, but logic modules do not typically perform their normal logic functions. In another embodiment, the functional module 104 can execute some functions, but at a slower frequency than in the normal power mode. Further, in another embodiment, the functional module 104 does not retain stored data in the low-power mode.

To place the functional module 104 in the low-power mode control information can be provided to the low-power control register 110. The control information can be written by software executing at the data processing device 100, by a different device via an external pin, and the like. The power mode control module 108 receives information from the low-power control register 110 and determines that the functional module 104 should be placed in a low-power mode. In response, it negates the signal LP_CTRL_B, thereby making the transistor 106 non-conductive. In addition, the low-power voltage module 107 is activated so that a low-voltage, such as a ground voltage, is applied at the $V_{SS}$ input, thereby placing the functional module 104 in the low-power mode. In another embodiment, the low-power voltage module 107 is not present, so that in the low-power mode no voltage is applied at the $V_{SS}$ input.

As used herein, the term "supply voltage" refers to a voltage supplied to a device or module upon which other voltages at the device or module are based. In the illustrated embodiment, the voltages $V_{SS}$ and $V_{DD}$ are supply voltages for the data processing device 100, while the voltage applied at the input $V_{SS}$ of the functional module 104 is a supply voltage for the module. Accordingly, because of the voltage drop across the transistor 106, the supply voltage for the functional module 104 is different than the supply voltage for the data processing device 100. This changes the voltage across the functional module 104 (i.e. the difference between the voltages $V_{SS}$ and $V_{DD}$), which can cause performance degradation at the functional module 104 in the normal power mode.

To return the functional module 104 to the normal mode, the data processing device 100 writes control information to the low-power control register 110 indicating the mode change. In response, the power control module 108 asserts the LP_CTRL_B signal. This causes the transistor 106 to become conductive, thereby applying the signal MOD_VSS to the functional module 104. In addition, the low-power voltage module 107 stops applying the low-power voltage to the $V_{SS}$ input, thereby returning the functional module 104 to the normal power mode.

The power diagnostic module 102 is configured to monitor and store information related to the voltage applied at the $V_{SS}$ input of the functional module 104, including information regarding the effect of the voltage drop across the transistor 106 on the performance of the functional module 104. The power diagnostic module 102 receives control information from the diagnostic control register 112 indicating when the performance information should be monitored and stored. In response, the power diagnostic module 102 records counter information associated with the frequency of a ring oscillator output powered by the $V_{SS}$ supply voltage and records counter information associated with the frequency of a ring oscillator powered by the MOD_VSS signal. The frequency information can be analyzed to determine the effect of the voltage drop across the transistor 106 on the operational frequency of the functional module 104 in the normal mode of operation.

The power diagnostic module 102 can also monitor and store the length of time the functional module 104 is in the low-power mode. For example, in response to negation of the LP_CTRL_B signal, the power diagnostic module 102 can use the REFCLK clock signal to adjust a counter. When the LP_CTRL_B signal indicates the functional module 104 has returned to the normal mode, the power diagnostic module 104 stops adjustment of the counter and stores the value recorded therein. This stored value can be used to determine the amount of time the functional module 104 was in the low-power mode. This information can be useful for a variety of analyses. For example, entering the low-power mode requires some overhead at the functional module 104, such as the switching of some logic gates, which consumes power. Accordingly, there is a power penalty associated with entering the low-power mode. The stored duration information can be used to determine the amount of power saved in the low-power mode relative to the power penalty associated with entering the low-power mode.

In addition, the power diagnostic module 104 can take voltage measurements of the MOD_VSS signal. The power diagnostic module 104 can record a single voltage measurement or multiple voltage measurements over time. These recorded measurements can be used to analyze the signal MOD_VSS while entering or exiting the low-power mode, thereby providing further data regarding the performance characteristics of the functional module 104.

The information recorded by the power diagnostic module 102 can be used during design of the data processing device 100 to determine whether the design complies with a device specification. The information can also be used during manufacturing to qualify the data processing device 100. Further, the information can be employed by the data processing device 100 when it is placed into its specified operating environment. For example, the power mode control module 108 could use the recorded information to determine when to place the functional module 104 in the low-power mode.

Figure 2:
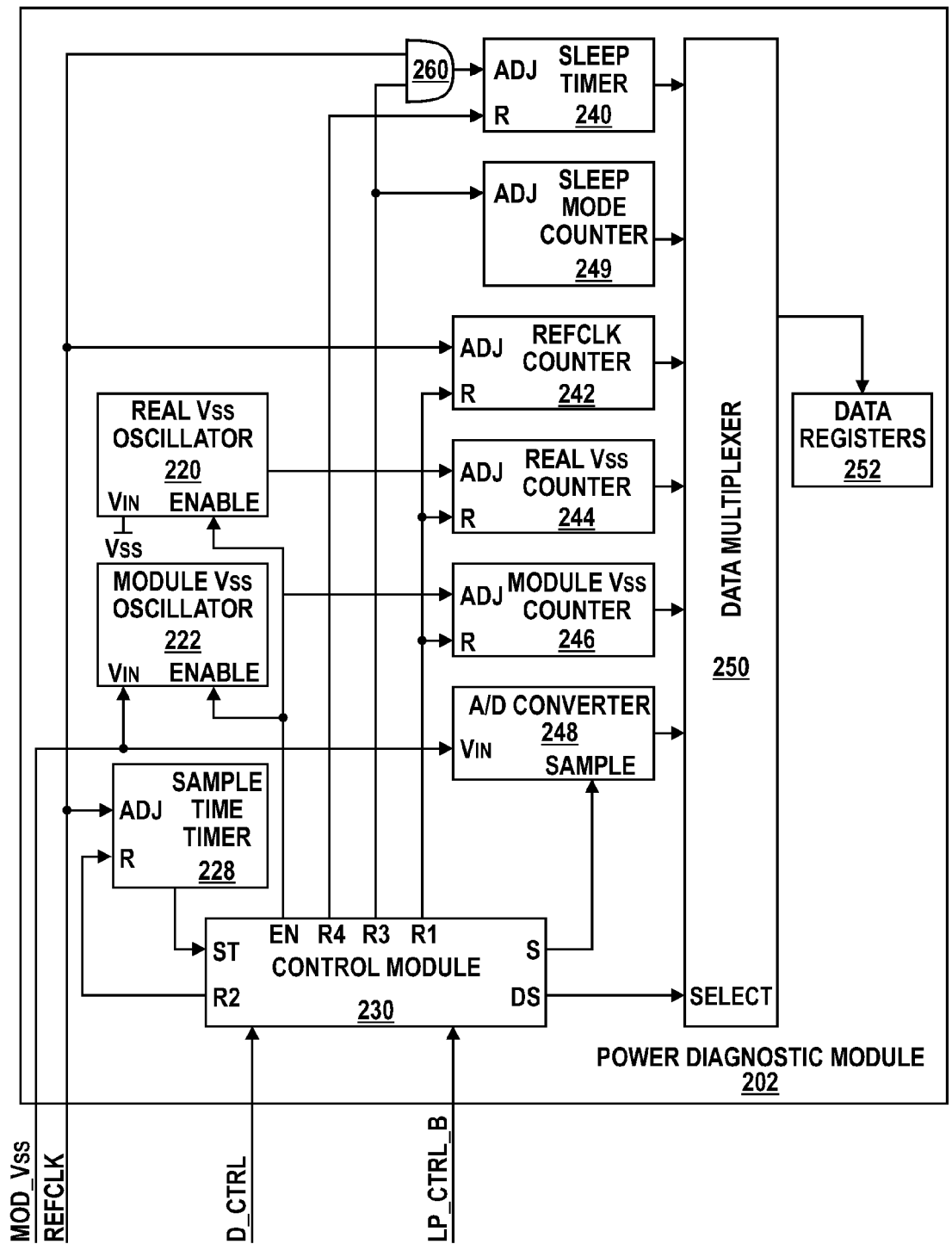
FIG. 2 is a combined circuit and block diagram of a particular embodiment of a power diagnostic module of FIG. 1.

Referring to FIG. 2, a combined block and circuit diagram of a particular embodiment of a power diagnostic module 202, corresponding to the power diagnostic module 102 of FIG. 1, is illustrated. The power diagnostic module includes an oscillator 220, an oscillator 222, timers 228 and 240, counters 242, 244, 246, and 249, an analog-to-digital (A/D) converter 248, a control module 230, a data multiplexer 250, a set of data registers 252, and an AND gate 260. The oscillator 220 includes an input labeled "ENABLE" to receive a signal labeled EN, an input labeled "$V_{IN}$" connected to the $V_{SS}$ voltage reference, and an output. The oscillator 222 includes an input labeled "ENABLE" to receive the signal EN, an input labeled "$V_{IN}$" to receive the signal MOD_VSS, and an output.

The timer 240 includes an input labeled "ADJ", an input labeled "R" to receive a signal labeled "R4", and an output. In a particular embodiment, the timer 240 is a counter. The AND gate 260 includes an output connected to the ADJ input of the timer 240, an input to receive the REFCLK signal, and an input to receive the R3 signal. The counter 242 includes an input labeled "ADJ" to receive the REFCLK signal, an input labeled "R" to receive a signal labeled "R1", and an output. The counter 244 includes an input labeled "ADJ" connected to the output of the oscillator 220, an input labeled "R" to receive the R1 signal, and an output. The counter 246 includes an input labeled "ADJ" connected to the output of the oscillator 222, an input labeled "R" to receive the R1 signal, and an output. The counter 249 includes an input labeled "ADJ" to receive the R3 signal and an output. The timer 228 includes an input labeled "ADJ" to receive the REFCLK signal, an input labeled "R" to receive the signal labeled "R2", and an output to provide a signal labeled "ST." In a particular embodiment, the timer 228 is a counter.

The A/D converter 248 includes an input labeled "$V_{IN}$" to receive the signal MOD_VSS, an input labeled "SAMPLE" to receive a signal labeled "S", and an output. The control module 230 includes an input to receive the D_CTRL signal, an input to receive the LP_CTRL_B signal an input to receive the signal labeled ST, outputs to provide the R1, R2, R3, R4, EN, and S signals, and an output to provide a signal labeled "DS." The data multiplexer 250 includes inputs connected to the respective outputs of the timer 240 and the counters 242, 244, 246, and 249, an input connected to the output of the A/D converter 248, and an output. The set of data registers 252 includes an input connected to the output of the data multiplexer 250. It will be appreciated that although for purposes of discussion the R1 reset signal is illustrated as a single signal, in other embodiments the control module 230 could apply individual reset signals to each of the counters 242, 244, and 246.

In operation, the control module 230 receives diagnostic control information via the signal D_CTRL requesting that the power diagnostic module 202 measure the effect of the transistor 106 on the performance of the functional module 104. The D_CTRL signal can represent information stored in a register. In response to receiving the control information, the control module 230 asserts the EN1 signal to enable the oscillators 220 and 222. The control module 230 also asserts the R1 signal to reset the counters 242, 244, and 246. It will be appreciated that a single signal could be used to enable the oscillators 220 and 222 and reset the counters 242, 244, and 246. In another particular embodiment, the R1 signal resets the values stored at the counters 242, 244 and 246 can be reset by writing values to each counter.

In response to assertion of the EN signal, the oscillator 220 provides an output signal with a frequency based on the reference voltage $V_{SS}$ received at the $V_{IN}$ input. In a particular embodiment, the oscillator 220 can include a divider to reduce the frequency of the output signal. The counter 244 adjusts a stored value based on transitions of the signal provided by the oscillator 220 at the ADJ input. Accordingly, the value stored at the counter 244 is indicative of the frequency of the signal provided by the oscillator 220, and is based upon the reference voltage $V_{SS}$.

In addition, in response to assertion of the EN signal, the oscillator 222 provides an output signal with a frequency based on the signal MOD_VSS received at the $V_{IN}$ input. In a particular embodiment, the oscillator 222 can include a divider to reduce the frequency of the output signal. The counter 246 adjusts a stored value based on transitions of the signal provided by the oscillator 222 at the ADJ input. Accordingly, the value stored at the counter 246 is indicative of the frequency of the signal provided by the oscillator 222, and is based upon the signal MOD_VSS.

Further, a value stored by the counter 242 is reset in response to the R1 signal, or by writing a value to the counter. The value is adjusted based on transitions of the clock signal REFCLK. Accordingly, the value stored at the counter 242 is indicative of the frequency of the REFCLK clock signal.

After a specified measurement time, which can be indicated via the diagnostic control information provided by the D_CTRL signal or can be indicated by a predetermined number of transitions of the REFCLK signal, the control module 230 sends control information to the data multiplexer 250 via the DS signal so that the values stored in the counters 242, 244, and 246 are recorded at the set of data registers 252. This information can be accessed via the data processing device 100 and used to analyze the effect of the transistor 106 on the operation of the functional module 104. For example, the difference in the values recorded at the counter 244 and the counter 246 indicate the effect of the voltage drop across the transistor 106 on the operational frequency of the functional module 104 during normal operation. The value recorded at the counter 242 can be used to provide a reference frequency for the other recorded frequency values.

In addition, in response to the LP_CTRL_B signal indicating that the data processing device 100 has entered a low-power mode for the first time since a reset event, such as a power-on or device, the control module 230 can assert the signal R4 to reset the timer 240. Alternatively, the value can be reset by writing a value to the timer 240. Further, in response to the data processing device 100 entering the low power mode, the control module can assert the signal R3 until the LP_CTRL_B signal indicates that the data processing device 100 has returned to the normal mode. In addition, in response to the R3 signal being asserted, the output of the AND gate 260 applies the REFCLK clock signal to the ADJ input of the timer 240. The value stored at the timer 240 is adjusted in response to transitions of the clock signal REFCLK. When the signal R3 is negated, indicating that the data processing device has returned to the normal mode of operation, the AND gate 260 stops applying the REFCLK clock signal to the ADJ input of the timer 240. Thus, the value recorded at the timer 240 after the R3 signal is negated is indicative of the amount of time that the data processing device was in the low-power mode since the reset event. The control module 230 can provide control information to the data multiplexer 250 so that the recorded value is stored at the set of data registers 252. The stored value can be accessed by the data processing device 100 for analysis.

Further, in response to assertion of the R3 signal, the value recorded at the counter 249 is adjusted. Accordingly, this value is indicative of the number of times that the data processing device 100 has been placed in the low-power mode. This recorded value can be stored at the set of data registers 252 for subsequent analysis. In addition, the value at the counter 249 can be written in order to reset the value. Accordingly, the value recorded at the counter 249 can indicated the number of times the data processing device 100 has been placed in the low-power mode since a previous reset.

In addition, in response to the LP_CTRL_B signal indicating that the data processing device 100 is entering or exiting the low-power mode, the control module 230 asserts the signal R2. In response, a recorded value at the timer 228 is reset to an initial value. Subsequently, the initial value is adjusted based on transitions of the REFCLK clock signal received at the ADJ input. When the recorded value at the timer 228 reaches a specified value, it asserts the ST signal. The specified value can be programmable, e.g., received via the D_CTRL signal, or it can be a predetermined value.

In response to assertion of the ST signal, the control module 230 asserts the S signal. In response to detecting an asserted S signal at its SAMPLE input, the A/D converter samples the signal MOD_VSS and converts the sample to a digital value. The digital value is provided to the multiplexer 250, and is stored at the set 252 of registers in response to control information received via the DS signal. The recorded value can be accessed via the data processing device 100 and used to determine the reference voltage applied at the functional module 104 as the data processing device 100 enters the low-power mode. This information can be useful in determining how quickly the functional module 104 enters the low-power mode.

In addition, in response to assertion of the ST signal the control module 230 can assert the R2 signal, resetting the recorded value at the timer 228 and initiating a new sample interval. Accordingly, multiple samples of the MOD_VSS can be converted to digital values, and the digital values stored at the set of data registers 252. The data processing device 100 can use these digital values to construct a profile of the voltage applied at the $V_{SS}$ input of the functional module 104 in response to the data processing device entering the low-power mode.

Further, the control module 230 can assert the S signal in response to control information provided via the D_CTRL signal. Accordingly, software executing at the data processing device 100 or a user can request immediate sampling of the MOD_VSS signal by writing the appropriate control information to register 112 (FIG. 1).

Figure 3:
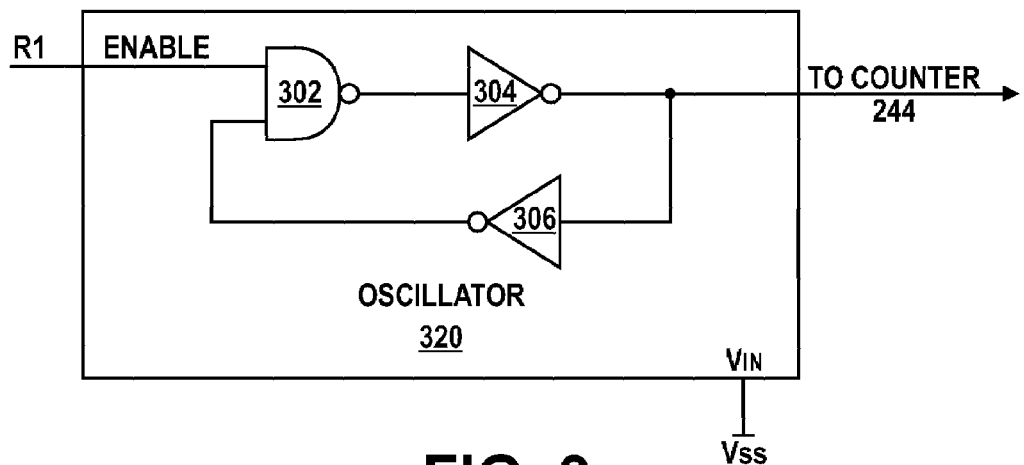
FIG. 3 is a block diagram of a particular embodiment of an oscillator of FIG. 2.

Referring to FIG. 3, a block diagram of an oscillator 320, corresponding to the oscillator 220 of FIG. 2, is illustrated. The oscillator 320 includes a NAND gate 302 and inverters 304 and 306. The NAND gate 302 includes an input connected to the ENABLE input to receive the signal R1, a second input, and an output. The inverter 304 includes an input connected to the output of the NAND gate 302 and an output to provide a signal to the counter 244. The inverter 306 includes an input connected to the output of the inverter 304 and an output connected to the second input of the NAND gate 302. The oscillator 320 also includes an input labeled $V_{IN}$ to receive the supply voltage $V_{SS}$.

In operation in response to assertion of the R1 signal, the configuration of the NAND gate 302 and the inverters 304 and 306 provides an oscillating signal at the output of the oscillator 320. The voltage applied at the $V_{IN}$ input is a supply voltage for the transistors of the NAND 302 and the inverters 304 and 306. Accordingly, the switching speed of the transistors is based upon the voltage applied at the $V_{IN}$ input. Thus, the frequency at the output of the oscillator 320 is based upon the supply voltage $V_{SS}$. A similar oscillator configuration can be used for the oscillator 222, so that the frequency of the output signal is based upon the MOD_VSS signal. The frequency of the output signals of each oscillator can be monitored and stored to determine power and performance characteristics for the data processing device 100. It will be appreciated that the oscillator 320 could include different inverting logic to provide an oscillating signal. For example, the oscillator 320 could include inverting logic that more closely matches one or more data paths of the functional module 104 so that the output signal more closely tracks the behavior of a signal at the functional module 104. This can provide for more accurate measuring of the performance characteristics for the data processing device 100.

Figure 4:
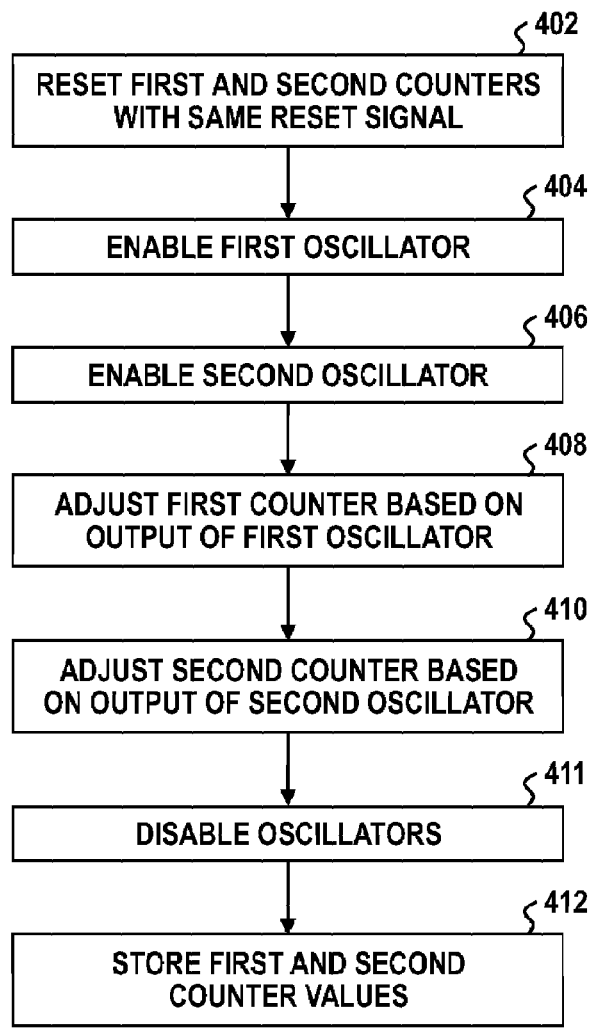
FIG. 4 is a flow diagram of a particular embodiment of a method of storing diagnostic information at a data processing device in accordance with one aspect of the present disclosure.

Referring to FIG. 4, a flow diagram of a particular embodiment of a method of storing diagnostic information is illustrated. At block 402 first and second counters are reset in a deterministic manner relative to each other. For example, they can be reset with a common reset signal. At block 404, a first oscillator is enabled and at block 406 a second oscillator is enabled. The oscillators can be enabled with the same signal used to reset the first and second counters. A supply voltage for a device is applied to the first ring oscillator, so that the oscillator provides an output signal with a frequency based on the supply voltage. A supply voltage applied at a functional module is applied to the second ring oscillator so that the oscillator provides an output signal with a frequency based on the applied voltage.

At block 408, the first counter is adjusted based on the frequency of the signal provided by the first oscillator. At block 410 a second counter is adjusted based on the frequency of the signal provided by the second ring oscillator. At block 411, the first and second oscillators are disabled. At block 412, the values recorded at the first and second counters are stored in memory. The stored values can be accessed to analyze the effect of power control circuitry on the performance of the functional module during normal operation.

Figure 5:
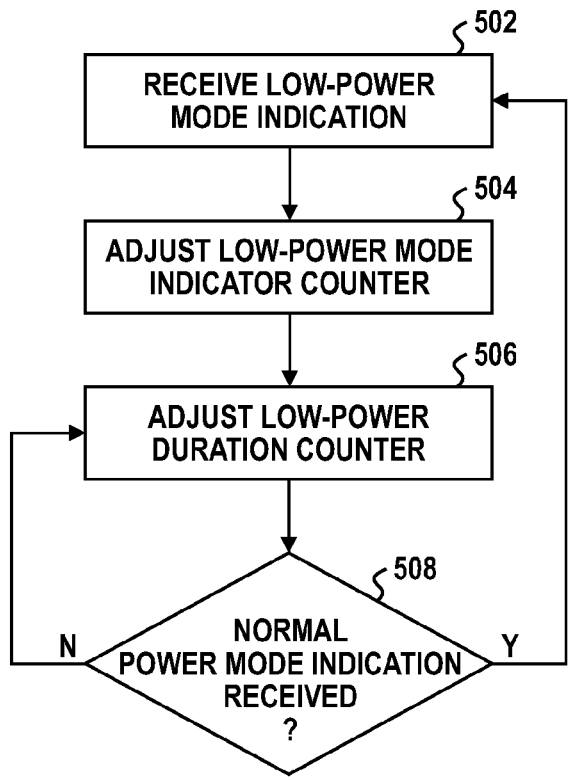
FIG. 5 is a flow diagram of a particular embodiment of a method of storing diagnostic information at a data processing device in accordance with one aspect of the present disclosure.

Referring to FIG. 5, a flow diagram of a particular embodiment of a method of storing diagnostic information is illustrated. At block 502, an indication is received that a data processing device has entered a low-power mode. At block 504, in response to receiving the indication a counter is adjusted. The counter indicates the number of times that the data processing device has entered the low-power mode.

At block 506, in response to receiving the low-power mode indicator, a low-power mode duration counter is adjusted. At decision block 508, the data processing device determines whether an indication has been received that the device has returned to a normal power mode. If not, the method flow returns to block 506 and adjustment of the low-power mode duration counter continues. If the normal power mode indication has been received, the method flow returns to block 502 and awaits another low-power mode indication. The value in the low-power mode duration counter and the value recorded at the low-power mode indicator counter can be read and analyzed to determine how often the data processing device enters the low-power mode, and how long it stays in that mode before returning to the normal power mode. This information can be used to refine the operation and design of the data processing device for improved power savings.

Figure 6:
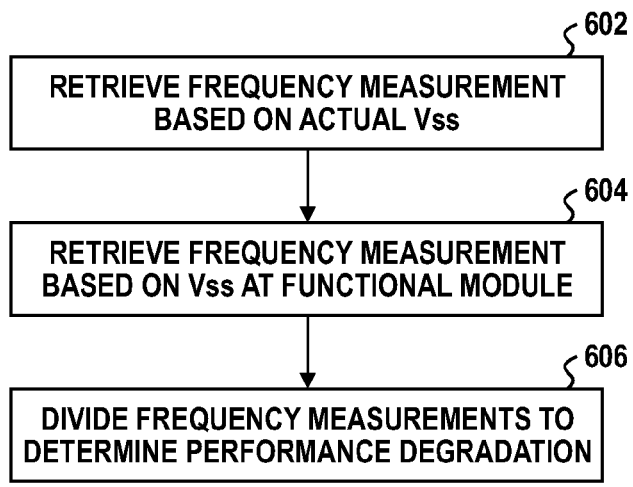
FIG. 6 is a flow diagram of a particular embodiment of a method of analyzing diagnostic information at a data processing device in accordance with one aspect of the present disclosure.

Referring to FIG. 6, a flow diagram of a particular embodiment of a method of analyzing diagnostic information at a data processing device is illustrated. At block 602, a frequency measurement that is based on a supply voltage for a data processing device is retrieved. At block 604, a frequency measurement based on a supply voltage applied at a functional module is retrieved. The supply voltage at the functional module is different from the supply voltage for the data processing device because of changes in the supply voltage due to power control circuitry. At block 606, one frequency measurement is divided by the other in order to determine a percentage value. This percentage value indicates the degradation in performance at the functional module resulting from the change in supply voltage.

Figure 7:
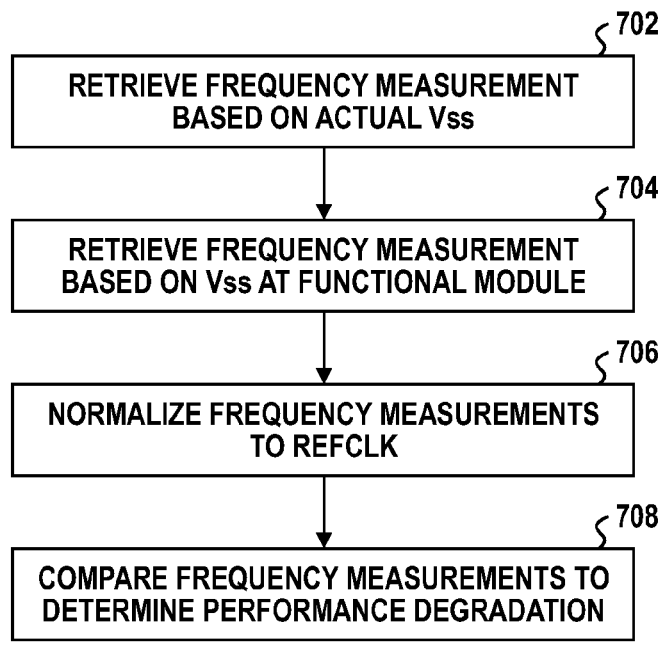
FIG. 7 is a flow diagram of another particular embodiment of a method of analyzing diagnostic information at a data processing device in accordance with one aspect of the present disclosure.

Referring to FIG. 7, a flow diagram of a particular embodiment of a method of analyzing diagnostic information at a data processing device is illustrated. At block 702, a frequency measurement that is based on a supply voltage for a data processing device is retrieved. At block 704, a frequency measurement based on a supply voltage applied at a functional module is retrieved. The supply voltage at the functional module is different from the supply voltage for the data processing device because of changes in the supply voltage due to power control circuitry. At block 706, the retrieved frequency measurements are normalized based on a frequency measurement of a reference clock signal. At block 708, the normalized frequency measurements are compared to determine performance degradation at the functional module resulting from the change in supply voltage.

Figure 8:
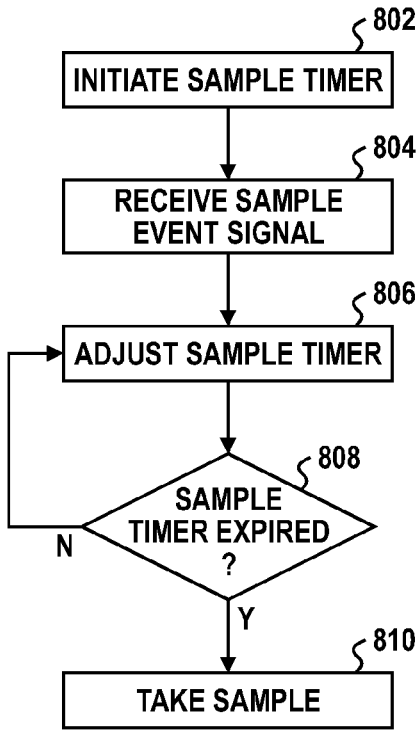
FIG. 8 is a flow diagram of a particular embodiment of a method of sampling a set of voltages at a data processing device in accordance with one aspect of the present disclosure.

Referring to FIG. 8, a flow diagram of a particular embodiment of a method of sampling a supply voltage at a functional module is illustrated. At block 802, a sample timer is initiated. At block 804 a sample event signal is received. The sample event signal indicates that a sampling event has taken place. For example, the sample event signal can indicate that a portion of a data processing device is entering a low-power mode. In response to the sample event signal, at block 806 a sample timer is adjusted. At block 808 it is determined whether the sample timer has expired. If not, the method flow returns to block 804 so to continue adjustment of the sample timer. If the sample timer has expired the method flow proceeds to block 810 and a voltage sample is taken and stored in memory. The recorded sample can be used to analyze the supply voltage at the functional module. For example, multiple samples can be recorded as the supply voltage changes due to the functional module entering or exiting a low-power mode. The samples can thereby indicate the change in the supply voltage due to the mode change, and can be analyzed to determine whether the data processing device meets specified performance criteria.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A device, comprising:
   a first oscillator comprising an enable input configured to receive an enable signal, a supply input configured to receive a first signal reference, and an output configured to provide a first output signal at a first frequency in response to the enable signal transitioning to a first state, the first frequency based on the first signal reference;

a second oscillator comprising an enable input configured to receive the enable signal, a supply input configured to receive a second signal reference, and an output configured to provide a second output signal at a second frequency in response to the enable signal transitioning to the first state, the second frequency based on the second signal reference;

a first counter comprising an input coupled to the output of the first oscillator; and a second counter comprising an input coupled to the output of the second oscillator.

2. The device of claim 1, wherein the first signal reference is based on a first supply voltage and the second signal reference is based on a second supply voltage.

3. The device of claim 1, further comprising a first transistor comprising a first current electrode coupled to the supply input of the first oscillator to provide the first signal reference and a second current electrode coupled to a first supply voltage and wherein the supply input of the second oscillator is coupled to the first supply voltage.

4. The device of claim 3, wherein the first transistor further comprises a control electrode configured to receive a mode control signal, wherein the mode control signal is indicative of a when a portion of an integrated circuit device is in a low-power state.

5. The device of claim 4, further comprising:
a logic gate comprising a first input to receive a reference clock signal, a second input configured to receive the mode control signal, and an output; and
a first timer comprising an input coupled to the output of the transistor, the first timer configured to adjust a stored value based on a signal at the input.

6. The device of claim 3, further comprising:
an analog-to-digital converter comprising an input coupled to the first current electrode of the first transistor, a sample enable input, and an output configured to provide a digital value in response to assertion of a signal at the sample enable input, the digital value representative of signal at the input.

7. The device of claim 6, further comprising:
a third counter comprising an input configured to receive a reference clock signal, an output configured to provide a value stored at the third counter, the third counter configured to adjust the value based on the input; and
a control module comprising an input coupled to the output of the third counter, and an output coupled to the sample enable input of the analog-to-digital converter, the control module configured to assert a signal at the output in response to a value at the input meeting a defined criteria.

8. The device of claim 6, wherein the sample enable input is configured to receive a signal indicative of when a portion of an integrated circuit device is entering a low-power mode.

9. The device of claim 1, wherein:
the first counter further comprises a first reset input configured to receive a reset signal, the first reset input configured to reset a value stored in the first counter based on the state of the reset signal; and
the second counter further comprises a second reset input configured to receive the reset signal, the second reset input configured to reset a value stored in the second counter based on the state of the reset signal.

10. The device of claim 9, wherein the reset signal is based on the enable signal.

11. The device of claim 9, further comprising a third counter comprising an input configured to receive a reference clock signal and a third reset input configured to receive the reset signal, the third reset input configured to reset a value stored in the third counter based on the state of the reset signal.

12. A method, comprising:
providing a first output signal from a first oscillator in response to receiving an enable indicator at the first oscillator, the first output signal having a first frequency based on a first signal reference;
providing a second output signal from a second oscillator in response to receiving the enable indicator at the second oscillator, the second output signal having a second frequency based on a second signal reference;
determining a first value at a first counter, the first value based on the first frequency;
determining a second value at a second counter, the second value based on the second frequency; and
storing the first value and the second value.

13. The method of claim 12, further comprising resetting the first counter and the second counter in response to the enable indicator.

14. The method of claim 12, wherein the first signal reference is based on a voltage at a first current electrode of a transistor and the second signal reference is based on a supply voltage, wherein the second current electrode of the transistor is coupled to the supply voltage.

15. The method of claim 14, further comprising receiving a mode control signal at a control electrode of the transistor, the mode control signal indicative of when a portion of an integrated circuit device is in a low-power state.

16. The method of claim 14, further comprising:
determining a third value based on the amount of time the portion of the integrated circuit device is in the low-power state; and
storing the third value.

17. The method of claim 16, further comprising adjusting a third counter in response to the portion of the integrated circuit entering the low-power state.

18. The method of claim 14, further comprising:
determining a digital value of a voltage at the first current electrode of the transistor in response to the mode control signal indicating the portion of the integrated circuit device is entering the low-power state; and
storing the digital value.

19. The method of claim 12, further comprising:
determining a third value in response to the enable indicator, the third value based on a frequency of a reference clock signal; and
storing the third value.

20. The method of claim 12, wherein the first oscillator and the second oscillator are ring oscillators.

* * * * *